United States Patent [19]
Takahashi

[11] Patent Number: 6,154,873
[45] Date of Patent: Nov. 28, 2000

[54] LAYOUT DESIGNING METHOD AND LAYOUT DESIGNING APPARATUS

[75] Inventor: Naoya Takahashi, Tokyo, Japan

[73] Assignee: NEC Corporation, Tokyo, Japan

[21] Appl. No.: 09/092,090

[22] Filed: Jun. 5, 1998

[30] Foreign Application Priority Data

Jun. 5, 1997 [JP] Japan ...................................... 9-148124

[51] Int. Cl.[7] ...................................................... G06F 17/50
[52] U.S. Cl. .............................................. 716/10; 716/17
[58] Field of Search .......................... 395/500.02–500.19; 716/1–21

[56] References Cited

U.S. PATENT DOCUMENTS

| | | | |
|---|---|---|---|
| 5,281,558 | 1/1994 | Bamji et al. | 716/2 |
| 5,357,140 | 10/1994 | Kozasa | 257/752 |
| 5,493,510 | 2/1996 | Shikata | 716/9 |
| 5,623,420 | 4/1997 | Yee et al. | 716/1 |
| 5,729,467 | 3/1998 | Katsumata et al. | 716/15 |
| 5,761,078 | 6/1998 | Fuller et al. | 716/16 |
| 5,798,936 | 8/1998 | Cheng | 716/13 |

FOREIGN PATENT DOCUMENTS

| | | | |
|---|---|---|---|
| 08036590 | 2/1996 | Japan | G06F 17/50 |
| 8-77225 | 3/1996 | Japan | G06F 17/50 |

OTHER PUBLICATIONS

Tsay et al. ("A row–based cell placement method that utilizes circuit structural properties", IEEE Transactions on Computer–Aided Design of Integrated Circuits and Systems, vol. 14, No. 3, Mar. 1995, pp. 393–397).

Her et al. ("Over–the–cell routing with cell orientations", IEEE, 1994 IEEE International Symposium on Circuits and Systems, May 30, 1994, vol. 1, pp. 471–4).

Kitazawa, et al. "Statistical Estimation of Block Shape in Polycell Layout", Information (data) Processing Society Program of 27th National Conference, Nagoya University, Japan, 1983, Jan. 1983.

*Primary Examiner*—Paul R. Lintz
*Assistant Examiner*—Phallaka Kik
*Attorney, Agent, or Firm*—Foley & Lardner

[57] ABSTRACT

A hierarchical layout designing method for an LSI has the step of determining the layout positions and shapes of hard macro blocks and a soft macro block, the step of forming a wiring which connects the hard macro blocks to each other and a path which passes above the soft macro block, the step of evaluating the influence which a wiring passing above the soft macro block will influence on the internal wiring of the soft macro block, a determination step of determining the extending direction in which the cell rows are to extend in the soft macro block, the step of forming in the soft macro block the cell rows in which cells are to be placed, and the step of calculating a first cost "COST x" in the case where the cell rows are formed extending in an x-axial direction and a second cost "COST y" in the case where the cell rows are formed extending in any-axial direction. By the determination step, the first cost "COST x" and the second cost "COST y" are compared with each other, and a direction in which the lower one of the first and second costs is attained is determined as the extending direction of the cell rows.

18 Claims, 10 Drawing Sheets

FIG.4A
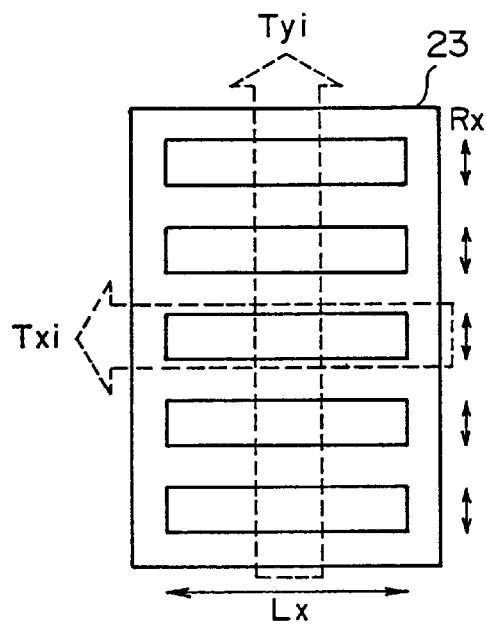
FIG.4B
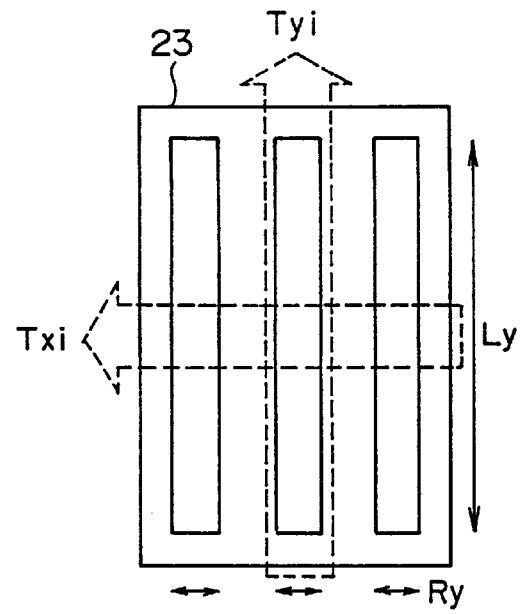
FIG.4C
| LAYER | i=1 | i=2 | i=3 | ..... |
|---|---|---|---|---|
| COEFFICIENT OF PASSABILITY IN CASE OF WIRING PARALLEL WITH CELL ROWS (Ohi) | 0.0 | 0.0 | 1.0 | |
| COEFFICIENT OF PASSABILITY IN CASE OF WIRING PERPENDICULAR TO CELL ROWS (Ovi) | 0.0 | 0.3 | 0.7 | |

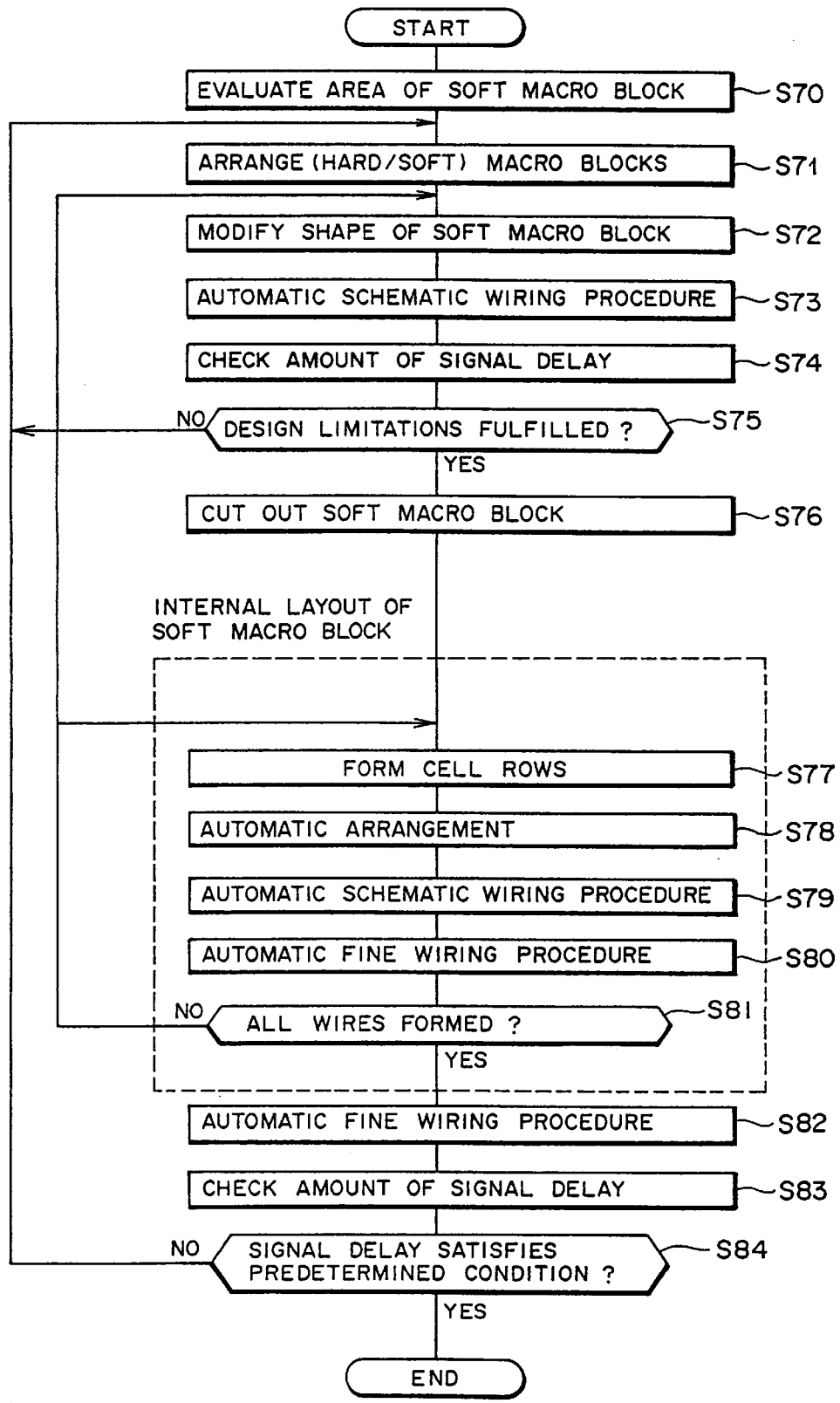

LAYOUT DESIGNING METHOD AND LAYOUT DESIGNING APPARATUS

BACKGROUND OF THE INVENTION

1. Field of the Invention

The present invention relates to a layout designing method and a layout designing apparatus, and more particularly to a method and apparatus for designing the hierarchical layout of an LSI.

2. Description of the Related Art

Of late, in accordance with an improvement in the density/performance of an LSI, a hierarchical designing technique has become used also to design layout. In particular, a top-down designing technique by which the design of a whole chip can be evaluated at an early stage has become important. In this designing technique, a floorplan for a chip, that is, the arrangement of hard and soft macros and the formation of schematic wiring paths for wires to connect those macros are firstly performed.

FIG. 8 is a flowchart showing a conventional method for designing the hierarchical layout of an LSI . FIGS. 9A, 9B, 10A and 10B illustrate examples of the layout designed by the hierarchical layout designing method shown in FIG. 8.

The conventional hierarchical layout designing method will now be described with reference to FIGS. 8 to 10B.

First of all, the area of a soft macro is evaluated using a calculation formula (step S70). As a method for evaluating the area, the technique disclosed by, for example, Published Unexamined Japanese Patent Application (Kokai) No. 08077225, can be employed. The contents of Japanese Patent Application No. 08077225 are incorporated in the present specification for reference.

Next, hard and soft macros are placed (step S71).

Following the above, the shape of the placed soft macro is modified so that a useless empty area does not occur on the chip (step S72).

FIG. 9A shows a plane of the LSI after the steps S70 to S72 have been executed. Hard macros 86 to 88 and a soft macro 89 are placed in a chip frame 85.

Thereafter, schematic wiring is performed on chip level such that schematic wiring paths are formed (step S73). In order to attain the performance required of this LSI, the wiring paths need to be as short as possible. In consideration of this, wires may be formed along paths which pass above the soft macro, if necessary. For example, when the hard macro 91 and the soft macro 93 need to be connected to each other as shown in FIG. 9B, wiring paths 95 which pass the soft macro 94 are preferred.

At that stage, the amount of signal delay is checked on chip level (step S74), and a determination is performed as to whether design constraints have been fulfilled or not (step S75). If the design constraints have not been fulfilled, the steps after the step S71, such as the rearrangement of the soft macro and so on, are repeated. If the design constraints have been fulfilled, the soft macro is extracted (step S76), and the internal layout of the soft macro is initiated (steps S77 to S83).

As regards the internal layout of the soft macro, all wires need to be completed with the wiring paths, which have been determined in the floorplan and which pass the soft macro, being kept as they are to the utmost.

A process for designing the internal layout of the soft macro will now be explained.

Firstly, cell rows in which cells are to be placed are formed (step S77). The direction in which the cell rows are formed is randomly determined by a designer. The number of cell rows is evaluated using a predetermined calculation formula. The size (the lateral width and height) of the soft macro varies when the number of cell rows is changed.

A wiring which can pass above the cell rows has constraints on its wiring layer, the wiring direction and the number of wires forming the wiring. The direction of the cell rows greatly influences whether the internal wiring of the soft macro and the wires forming the wiring which passes the soft macro can be formed along predetermined paths. FIGS. 10A and 10B show this matter.

In FIG. 10A, cell rows 98 extend in the soft macro 96 in a direction along the x-axis (an x-axial direction). A wiring (passing wiring) 97 is formed a certain layer and is predetermined to pass above the soft macro 96, during the layout design performed on chip level.

When the cells are placed in the cell rows, many of the wires forming the passing wiring 97 cannot be formed along the designed paths in the case where the cells have areas (obstructed areas) 99 which the passing wiring 97 I not allowed to pass, for example, areas where the passing wiring 97, if formed passing those areas, would meet the internal wiring of the cells. Under this condition, the wires have to be formed along paths slightly different from those designed, and the amount of space occupied by the wires is large.

In FIG. 10B, cell rows 102 extend in a soft macro 100 in a direction along the y-axis (an y-axial direction). In this case, the obstructed areas 103 of the cell rows 102 do not obstruct the passage of a passing wiring 101.

Actually the relationship between a wiring layer and an area which the wiring layer is not allowed to pass is complicated, and it is difficult for the designer to determine the optimum direction of the cell rows In consideration of this, the cell rows which all soft macros on the chip have are normally designed so as to extend in the same direction. The direction is changed only in the case where the soft macros include a soft macro which is extremely long a vertical direction and/or a soft macro which is extremely long in a lateral direction. The aspect ratio which improves the integration density is known to some extent, the direction according to the aspect ratio is adopted.

Thus, the optimum direction of the cell rows has been conventionally determined based on the experiences of the designer. The wiring efficiency owing to a wiring layer for the passing wiring, the wiring direction and the number of wires is not adequately taken into consideration.

After the cell rows are formed by the step S77, the cells are automatically placed in the cell rows (step S78). Following this, the internal wiring of the soft macro are formed by an automatic schematic wiring procedure (step S79) and an automatic detailed wiring procedure (step S80). As regards those of the wires whose paths have been predetermined and which are to pass the soft macro, changes if being made in their paths will influence the design of the whole chip. Therefore, such wires are formed prior to other wires so that they can be formed along the schematic paths determined in advance.

At this point, it is determined whether all wires have been formed without departing from wiring rules (step S81).

When it is determined that all wires have been formed without departing from the wiring rules, the designing of the internal layout of the soft macro is stopped, the detailed wiring procedure is conducted on chip level (step S82), and the amount of delay is checked again on chip level (steps S83 and S84).

In the case where the wires making up a passing wiring are formed along paths which differ considerably from those designed, it may be determined in the step S84 that the signal delay does not satisfy a predetermined condition.

In that case, the steps after the steps S72 or S77 are repeated, and the interior of the soft macro and the entirety of the chip are redesigned.

Also in the case where the formation of all wires in the soft macro block cannot be completed, the steps after the step S72 or S77 are repeated, and the interior of the soft macro block and the entirety of the chip are redesigned.

Thus, according to the conventional hierarchical layout designing method, there is no means for associating, with each other, the wiring layer of the wiring passing the soft macro, the wiring direction, the number of wires and the direction of the cell rows formed in the soft macro. This entails the possibility of the cell rows being designed so as to extend in such a direction as cannot reserve the paths for the wires. If the cell rows are designed so, the passing wiring will have to be formed avoiding the soft macro, resulting in the wiring being longer than designed. The performance of the chip may not reach the desired level, and wiring procedures may not able to be completed due to the deviation of the wiring in the soft macro from that evaluated. This incurs a problem such as that the designing period become longer than expected due to redesigning.

SUMMARY OF THE INVENTION

It is accordingly an object of the present invention to reduce the designing period.

It is a further object of the present invention to enable layout designing to be performed with high efficiency.

According to the first aspect of the present invention having the above-described objects, there is provided a hierarchical layout designing method for a semiconductor device. The method is for determining layout positions in which hard macro blocks and a soft macro block are to be placed, forming a wiring which connects the hard macro blocks to each other and a path which passes above the soft macro block, forming cell rows in which cells are to be placed in the soft macro block, and forming an internal wiring of the soft macro block. The method comprises the steps of evaluating (an evaluation step) an extent of an influence which a wiring passing above the soft macro block will exert on the internal wiring of the soft macro block; and of determining (a determination step) an extending direction in which the cell rows are to extend in the soft macro block.

According to the above-described designing method, the extending direction of the cell rows in the soft macro block is determined taking into consideration the influence which the wiring, which passes above the soft macro block, will exert on the internal wiring of the soft macro block. This enables layout designing to be performed with improved efficiency.

The evaluation step includes a step of evaluating the extent of the influence which the wiring passing above the soft macro block will exert on the internal wiring of the soft macro block, based on wiring layers for forming the wiring passing above the soft macro block, wiring directions and the number of wires forming the wiring, for example.

The evaluation step may include a step of calculating a first cost and a second cost, the first cost being a cost when the cell rows are formed extending in a first direction, and the second cost being a cost when the cell rows are formed extending in a second direction. In this case, by the determination step, the first and second costs are compared with each other, and a direction in which a lower one of the first and second costs is attained is determined as the extending direction of the cell rows.

By the evaluation step, costs when a wiring formed from each of wiring layers passes above the soft macro block, may be calculated, and maximum values of the costs calculated in association with the wiring layers may be obtained. In this case, based on the obtained maximum values, the extending direction of the cell rows is determined by the determination step.

The evaluation step includes a step of calculating a first sum of a cost when a wiring extending in a first direction passes above the soft macro block and a cost when a wiring extending in a second direction passes above the soft macro, in the case where the cell rows are formed extending in the first direction, for example, and a step of calculating a second sum of a cost when the wiring extending in the first direction passes above the soft macro block and a cost when the wiring extending in the second direction passes above the soft macro block, in the case where the cell rows are formed extending in the second direction. In this case, by the determination step, the first and second sums are compared with each other, and a direction in which a lower one of the first and second sums is attained is determined as the extending direction of the cell rows.

When the number of wiring layers is "n", the evaluation step includes a step of calculating, in association with each of wiring layers, costs when a wiring extending in a first direction passes above the soft macro block and costs when a wiring extending in a second direction passes above the soft macro block, in the case where the cell rows are formed extending in the first direction, for example, and a step of calculating a first sum of a maximum value of the calculated costs when the wiring extending in the first direction passes above the soft macro block and a maximum value of the calculated costs when the wiring extending in the second direction passes above the soft macro block, and a step of calculating, in association with each of the wiring layers, costs when the wiring extending in the first direction passes above the soft macro block and costs when the wiring extending in the second direction passes above the soft macro block, in the case where the cell rows are formed extending in the second direction, and a step of calculating a second sum of a maximum value of the calculated costs when the wiring extending in the first direction passes above the soft macro block and a maximum value of the calculated costs when the wiring extending in the second direction passes above the soft macro block. In this case, by the determination step, the first sum and the second sum are compared with each other, and the cell rows are formed extending in the first direction when the first sum is smaller than the second sum, and the cell rows are formed extending in the second direction when the second sum is smaller than the first sum.

The hierarchical layout designing method may further comprise a step of correcting at least one of a shape and size of the soft macro block and at least one of a shape and size of the cell rows, based on the costs calculated by the evaluation step. Correcting the shapes and sizes of the soft macro block and the cell rows in accordance with the extent of the influence enables layout designing to be performed with further improved efficiency.

According to the second aspect of the present invention having the above-described objects, there is provided a hierarchical layout designing apparatus comprising:

means for arranging hard macro blocks and a soft macro block;

means for forming a wiring which connects the hard macro blocks to each other and a path which passes above the soft macro block;

evaluation means for evaluating an extent of an influence which a wiring passing above the soft macro block will exert on an internal wiring of the soft macro block; and formation means for forming the cell rows in the soft macro block after determining an extending direction in which the cell rows are to extend in the soft macro block, based on the evaluated extent of the influence.

The above designing apparatus determines the extending direction of the cell rows in the soft macro block, taking into consideration the influence of the wiring passing above the soft macro will exert on he internal wiring of the soft macro block. This permits layout designing to be performed with improved efficiency.

The evaluation means may include means for evaluating the extent of the influence which the wiring passing above the soft macro block will exert on the internal wiring of the soft macro block, based on wiring layers for forming the wiring passing above the soft macro block, wiring directions and the number of wires forming the wiring.

The evaluation means may include means for calculating a first cost and a second cost, the first cost being a cost when the cell rows are formed extending in a first direction, and the second cost being a cost when the cell rows are formed extending in a second direction.

The formation means may include means for comparing the first and second costs with each other and forming the cell rows after determining, as the extending direction of the cell rows, a direction in which a lower one of the first and second costs is attained.

The evaluation means may include means for calculating costs when a wiring formed from each of wiring layers passes above the soft macro block, and for calculating maximum values of the costs calculated in association with the wiring layers; and the formation means may include means for determining the extending direction of the cell rows, based on the obtained maximum values.

The evaluation means may include means for calculating a first sum of a cost when a wiring extending in a first direction passes above the soft macro block and a cost when a wiring extending in a second direction passes above the soft macro, in the case where the cell rows are formed extending in the first direction, and means for calculating a second sum of a cost when the wiring extending in the first direction passes above the soft macro and a cost when the wiring extending in the second direction passes above the soft macro, in the case where the cell rows are formed extending in the second direction; and the formation means may include means for comparing the first and second sums with each other and determining, as the extending direction of the cell rows, a direction in which a lower one of the first and second sums is attained.

When the number of wiring layers is "n", the evaluation means may include means for calculating, in association with each of wiring layers, costs when a wiring extending in a first direction passes above the soft macro block and costs when a wiring extending in a second direction passes above the soft macro block, in the case where the cell rows are formed extending in the first direction, and means for calculating a first sum of a maximum value of the calculated costs when the wiring extending in the first direction passes above the soft macro block and a maximum value of the calculated costs when the wiring extending in the second direction passes above the soft macro block, and means for calculating, in association with each of the wiring layers, costs when the wiring extending in the first direction passes above the soft macro block and costs when the wiring extending in the second direction passes above the soft macro block, in the case where the cell rows are formed extending in the second direction, and means for calculating a second sum of a maximum value of the calculated costs when the wiring extending in the first direction passes above the soft macro block and a maximum value of the calculated costs when the wiring extending in the second direction passes above the soft macro block; and the formation means may include means for comparing the first sum and the second sum with each other, and forming the cell rows so as to extend in the first direction when the first sum is smaller than the second sum and forming the cell rows so as to extend in the second direction when the second sum is smaller than the first sum.

The hierarchical layout designing apparatus may further comprise means for correcting at least one of a shape and size of the soft macro block and at least one of a shape and size of the cell rows, based on the costs calculated by the evaluation means.

According to the third aspect of the present invention, there is provided a recording medium in which a program has been recorded, the program being for making a computer execute:

a step of determining layout positions in which hard macro blocks and a soft macro blocks are to be placed;

a step of forming a wiring which connects the hard macro blocks to each other and a path which passes above the soft macro block;

an evaluation step of evaluating an influence which a wiring passing above the soft macro will exert on an internal wiring of the soft macro block; and a step of determining a direction in which the cell rows are to extend in the soft macro block.

A program for making the computer further execute a correction step of correcting at least one of a shape and size of the soft macro block and at least one of a shape and size of the cell rows, based on the influence calculated by the evaluation step, may have been recorded in the recording medium.

BRIEF DESCRIPTION OF THE DRAWINGS

FIGS. 4A to 4C are diagrams showing the example of data used to carry out the step, recited in FIG. 3, of determining the direction of the cell rows in the soft macro block;

FIG. 8 is a flowchart showing a conventional hierarchical layout designing method;

DETAILED DESCRIPTION OF THE PREFERRED EMBODIMENT

Embodiments of the present invention will now be described with reference to the drawings.

First Embodiment

Figure 1:
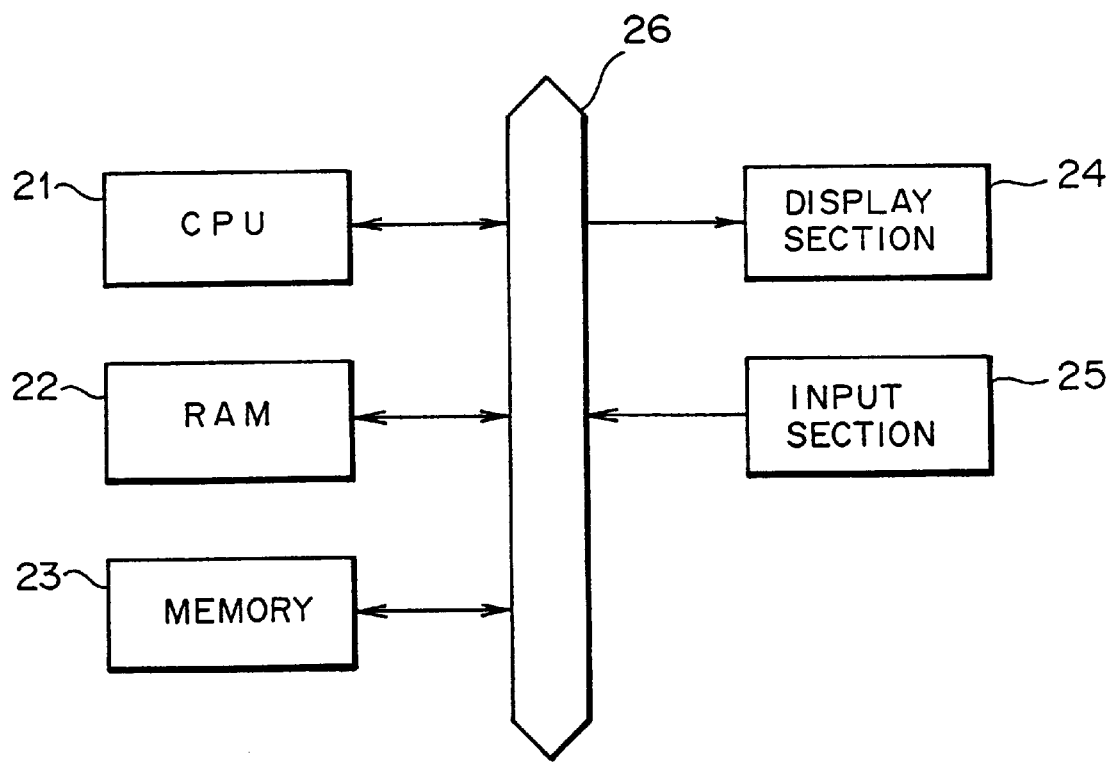
FIG. 1 is a block diagram showing the structure of a layout designing apparatus according an embodiment of the present invention.

FIG. 1 illustrates the structure of a hierarchical layout designing apparatus according to the present invention. As illustrated in this drawing, the layout designing apparatus 11 has a CPU (Central Processing Unit) 21, a RAM (Random Access Memory) 22, an auxiliary memory 23, a display section 24 and an input section 25, all being connected to each other via a bus 26.

The CPU 21 is formed of a microprocessor unit (MPU) or the like, and reads out and execute a layout designing program stored in the memory 23.

The RAM 22 is formed of a semiconductor memory and is used as the main storage area for the CPU 21.

Figure 2:
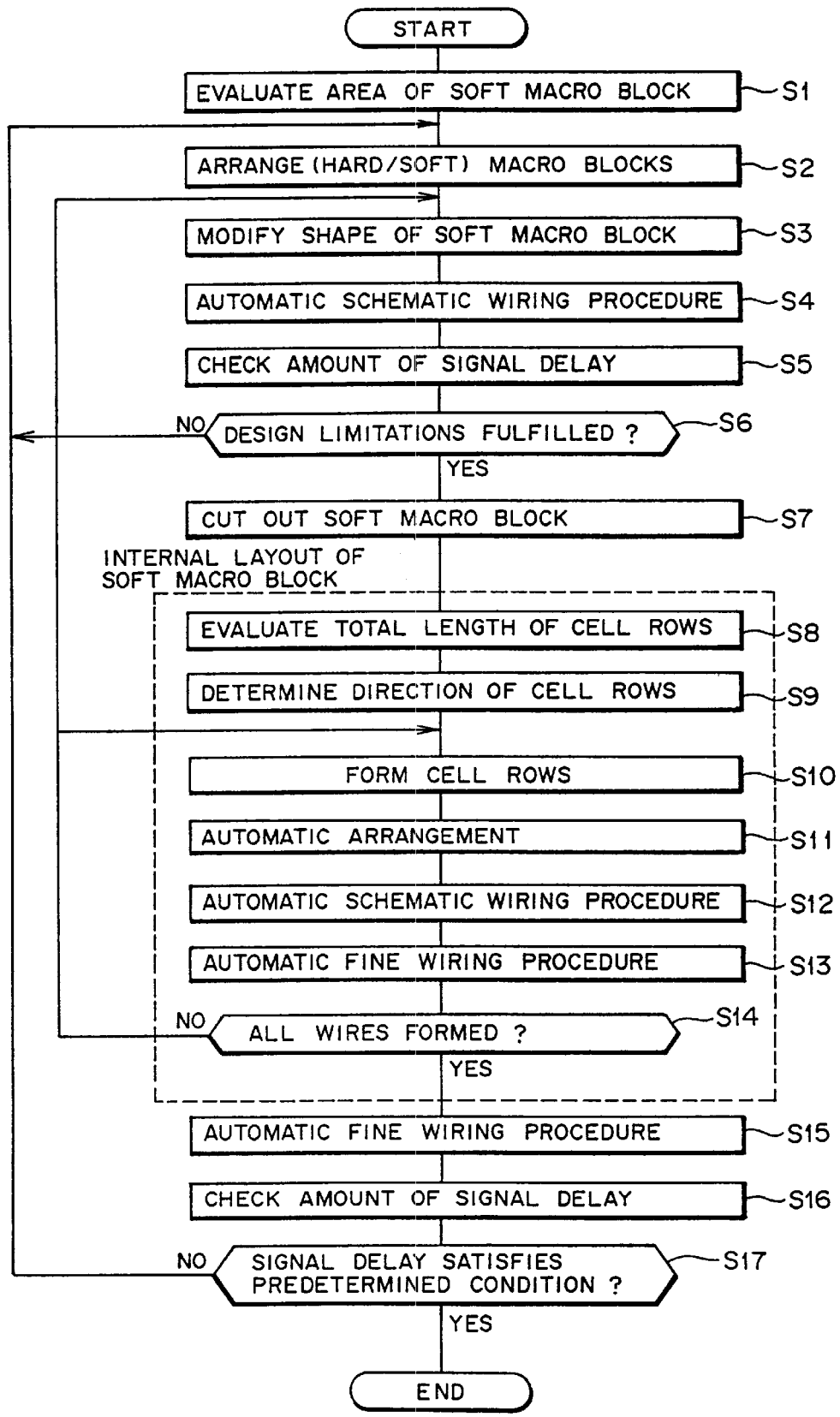
FIG. 2 is a brief flowchart for explaining a layout designing method according to the first embodiment of the present invention.

The memory 23 is formed of a magnetic disk device or the like, and stores programs, computing equations, data, etc. for executing the layout designing process shown in the flowchart of FIG. 2.

The display section 24 is formed a liquid crystal display device, a CRT or the like, and displays a plot plan of a chip in a design phase and various messages.

The input section 25 has a keyboard, a mouse, etc. for inputting instructions and data.

Next a method for designing the layout of a semiconductor chip through the use of the hierarchical layout designing apparatus having the structure illustrated in FIG. 1, will be explained.

In response to an instruction from the input section 25, the CPU 21 reads out a program stored in the memory 23, supplies the program to the RAM 22 and executes it in order to initiate the process shown in FIG. 2.

Firstly, the area of a soft macro (hereinafter referred to as the soft macro block) is evaluated using a calculation formula (step S1).

Next, a hard macro (hereinafter referred to as the hard macro block) and the soft macro block are placed on the chip (step S2).

Following the above, the shape of the placed soft macro block is modified so that a useless empty area does not occur on the chip (step S3).

Thereafter, the schematic wiring procedure is performed on chip level (on the whole chip) such that schematic wiring paths are formed (step S4). When needed, wires are formed along paths which pass above the soft macro block, in order to shorten the wires.

At that stage, the amount of signal delay is checked on chip level (step S5), and a determination is performed as to whether design constraints have been fulfilled or not (step S6). If the design constraints have not been fulfilled, the steps after the step S2, such as the rearrangement of the soft macro block and so on, are repeated.

If the design constraints have been fulfilled, the soft macro block is extracted (cut out) (step S7), and procedures for designing the internal layout of the soft macro block are initiated.

Firstly, the total length of required cell rows is evaluated according to a required specification (step S8).

Then, taking into consideration a wiring layer for a passing wiring (which passes above the macro cell block) of the soft macro block, the wiring directions (the x-axial direction, the y-axial direction) and the number of wires, the direction (the x-axial direction, the y-axial direction) in which the cell rows are to extend is determined (step S9).

Following the above, the cell rows are formed extending in the determined direction (step S10).

After the cell rows are formed by the step S10, cells are automatically placed in the cell rows (step S11). Next, the internal wiring of the soft macro block is formed by the automatic schematic wiring procedure (step S12) and the automatic detailed wiring procedure (step S13). As regards those of the wires whose paths have been predetermined and which are to pass the soft macro, changes if being made in the paths will influence the design of the whole chip. Therefore, such wires are formed prior to other wires so that they can be formed along the schematic paths determined in advance.

At this point, it is determined whether all wires have been formed without departing from wiring rules (step S14).

If it is determined that all wires have been formed without departing from the wiring rules, the designing of the internal layout of the soft macro is stopped, the detailed wiring procedure is conducted on chip level (step S15), and the amount of signal delay is checked again on chip level (steps S16 and S17).

In the case where it is determined in the step S17 that the signal delay does not satisfy a predetermined condition, the steps after the step S2 or S10 are repeated, an d the interior of the soft macro block and the entirety of the chip are redesigned.

Also in the case where procedures for forming the internal wiring of the soft macro block cannot be completed, the steps after the step S3 or S10 are repeated, and the interior of the soft macro block and the entirety of the chip are redesigned.

In the case where it is determined in the step S17 that the signal delay satisfies a predetermined condition, designing is finished.

A "process for determining the direction of the cell rows in the soft macro block", which process is executed in the step S9 shown in FIG. 2, will now be described in detail with reference to FIG. 3.

Figure 3:
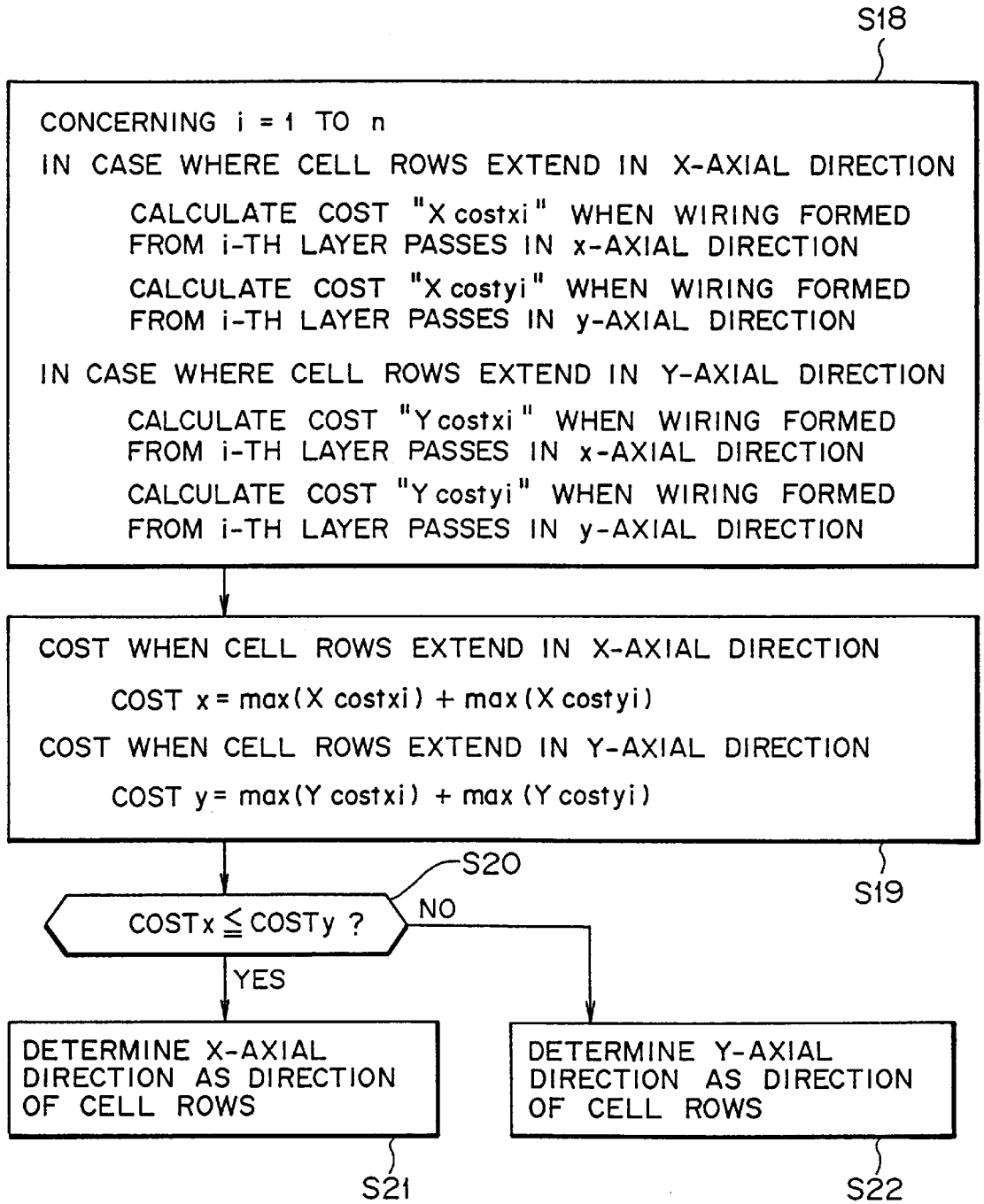
FIG. 3 is a flowchart showing the step (S9), recited in FIG. 2, of determining the direction of cell rows in a soft macro block.

FIG. 3 is a flowchart explaining the contents of the process executed in the step S9 shown in FIG. 2.

Firstly, assuming that the cell rows are formed extending in the x-axial direction, the influence which a wiring formed from a certain wiring layer (i-th layer) will exert on the internal wiring of the soft macro block if the wiring passes above the soft macro block in the x-axial direction, and the influence which the wiring will exert on the internal wiring of the soft macro block if the wiring passes above the soft macro block in the y-axial direction, are calculated as costs. Similarly, assuming that the cell rows are formed extending in the y-axial direction, the influence which the wiring will exert on the internal wiring of the soft macro block if the wiring passes above the soft macro block in the x-axial direction, and the influence which the wiring will exert on the internal wiring of the soft macro block if the wiring passes above the soft macro block in the y-axial direction, are calculated as costs (step S18).

In the case where the number of wiring layers is "n" ("n" wiring layers which the wiring forms are stacked on one another), the influence which the wiring will exert on the internal wiring of the soft macro block if the wiring passes above the soft macro block in the x-axial direction, and the influence which the wiring will exert on the internal wiring of the soft macro block if the wiring passes above the soft macro block in the y-axial direction, are calculated in regard to each wiring layer (i=1 to n) as the costs "X costxi" and "X costyi", respectively, on the assumption that the cell rows are formed extending in the x-axial direction. Similarly, the influence which the wiring will exert on the internal wiring of the soft macro block if the wiring passes above the soft macro block in the x-axial direction, and the influence which the wiring will exert on the internal wiring of the soft macro block if the wiring passes above the soft macro block in the y-axial direction, are calculated in regard to each wiring layer (i=1 to n) as the costs "Y costxi" and "Y costyi", respectively, on the assumption that the cell rows are formed extending in the y-axial direction.

Then the cost "COST x" when it is assumed that the cell rows are formed extending in the x-axial direction, and the cost "COST y" when it is assumed that the cell rows are formed extending in the y-axial direction, are calculated (step S19). The cost "COST x" is the sum of the highest one of the passing costs "X costxi", calculated by the step S18 in regard to each wiring layer (i), and the highest one of the passing costs "X costxi" calculated by the step S18 in regard to each wiring layer (i). The cost "COST y" is the sum of the highest one of the costs "Y costxi" calculated by the step S18 in relation to each wiring layer (i), and the highest one of the costs "Y costxi" calculated by the step S18 in relation to each wiring layer (i).

That is, the costs "COST x" and "COST y" are calculated by the following equations (1) and (2):

$$\text{COST x} = \max(\text{X costxi}) + \max(\text{X costyi}) \quad (1)$$

$$\text{COST y} = \max(\text{Y costxi}) + \max(\text{Y costyi}) \quad (2)$$

The costs "COST x" and "COST y" are compared with each other (step S20), and such a direction that the lower one of those costs is attained is determined as the direction of the cell rows. More specifically, in the case of COST x≦COST y, the x-axial direction is determined as the direction of the cell rows (step S21). In the case of COST x>COST y, the y-axial direction is determined as the direction of the cell rows (step S22).

Figure 5A:
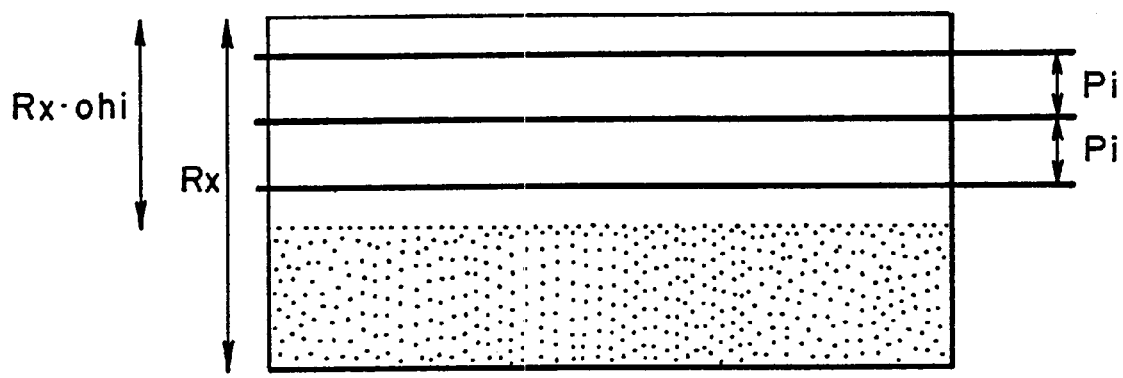
FIGS. 5A and 5B are conceptual diagrams for explaining the technique of calculating the number of wires which can pass through the cell rows.
Figure 5B:
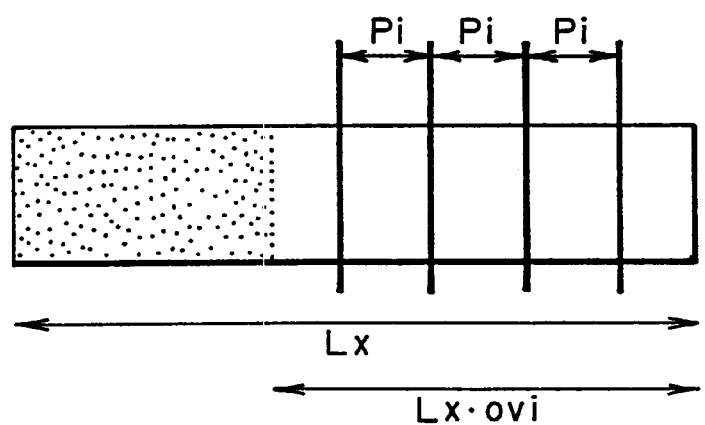

FIGS. 4A and 4B show examples of data used to determine the direction of the cell rows in the soft macro block. FIGS. 5A and 5B are conceptual diagrams showing the technique of obtaining the number of wires which can pass the cell rows.

The data used in the processes will now be explained with reference to FIGS. 4A to 4C.

Let it be assumed that the number of wires formed from a wiring layer (i) and which pass above a soft macro block 23 in the x-axial direction is "T xi", while the number of wires formed from the wiring layer (i) and which pass above the soft macro blocks 23 in the y-axial direction is "T yi", as shown in FIGS. 4A and 4B. Let it be further assumed that the total length of the cell rows, calculated by the step S8 shown in FIG. 2, is "L all". The number of cell rows when the cell rows extend in the x-axial direction, and that when the cell rows extend in the y-axial direction, are obtained from "L all" (in FIG. 4A, the number of cell rows is five, while in FIG. 4B, the number of cell rows is three). Furthermore, in each of those cases, the cell row lengths "Lx" and "Ly" and the cell row heights "Rx" and "Ry" are calculated. The height "Rx" can be calculated by {(height of one cell row)×n} when the number of cell rows is "n". The height "Ry" can be calculated in the same manner.

As shown in FIG. 4C, the coefficients of the passability (the ratio of the length/width of a passable wiring to the length/width of a cell row) are prepared library by library (part by part) in advance. In other words, the coefficient "O hi" when the wiring formed from the i-th wiring layer passes parallel with the cell rows and the coefficient "O vi" when the wiring formed from the i-th wiring layer passes perpendicular to the cell rows, are determined in advance. In regard to each wiring layer (i=1 to n), the values of "O hi" and "Ovi" are determined in a range of values 0 to 1. When no wires can freely pass above the cell rows, the values of "O hi" and "Ovi" are 0. When all wires can freely pass above the cell rows, the values of "O hi" and "Ovi" are 1. The wiring pitch of each wiring layer is also stored library by library as "Pi". Using those values, the passing costs are calculated in regard to each wiring layer (i), and the sum of the passing costs is used as the final passing cost.

The way of obtaining the passing costs in the case where the cell rows are formed extending in the x-axial direction will now be explained with reference to FIGS. 5A and 5B.

The number "M" of wires which can pass above the cell rows when the wires formed from the i-th layer pass above the cell rows in the direction in which the cell rows extend as shown in FIG. 5A, is calculated from the following equation (3):

$$M = A \,(Rx \cdot O\, hi/Pi) \quad (3)$$

where "A" is a predetermined coefficient, "(Rx·O hi/Pi)" is the number of wires which can pass above one wiring cell, "Rx" is the total height of the cell rows, "O hi" is the wiring coefficient, and "Pi" is the wiring pitch.

FIG. 5A schematically shows "(Rx·O hi/Pi)". Of the area represented by the total height "Rx" of the cell rows in FIG. 5A, that part which wires can pass is represented by "Rx O hi". By dividing "Rx·O hi" by the wiring pitch "Pi" of the i-th layer, the number of wires which can pass above one cell row can be obtained. Depending on which values are used in a formula to evaluate the wiring area in the macro block at the time the size of the macro block is evaluated, a value between 0 to 1 is determined as the coefficient A. For example, when the area evaluated on the precondition that an area expanding above the cell rows in the macro block not be used as a normal wiring area, value 1 is determined as the coefficient A. In this case, a passing wiring can be freely formed in the area expanding above the cell rows. The cost in the case where the wiring formed from the i-th layer passes above the cell rows can, therefore, be obtained from the following equation (4):

$$X\, \text{costxi}\,(T\, xi, R\, x) = Pi\,\{T\, xi - a\,(R\, x \cdot O\, hi/Pi)\} \quad (4)$$

As in the case of FIG. 5A, the number "M" of wires which can pass above the cell rows when the wires formed from the i-th layer pass above the cell rows in the direction in which the cell rows extend as shown in FIG. 5B, is calculated from the following equation (5):

$$M = B (Lx \cdot Ovi/Pi) \quad (5)$$

FIG. 5B schematically shows (Lx·Ovi/Pi). Of the area represented by "Lx" showing the cell row length, that part which the wires can pass is represented by "Lx·O hi" in FIG. 5B. By dividing "Lx·O hi" by the wiring pitch "Pi" of the i-th layer, the number of wires which can pass above one cell row can be obtained. Depending on which values are used in the formula to evaluate the wiring area in the macro block when the size of the macro block is evaluated, a value between 0 to 1 is determined as the coefficient B, as in the case of the coefficient A. Utilizing the coefficient B, the cost in the case where the wiring formed from the i-th layer passes above the cell rows can be obtained from the following equation (6):

$$X \text{ costyi } (T yi, L x) = Pi \{T yi - b (L x \cdot O vi/Pi)\} \quad (6)$$

In the case where the cell rows are formed extending in the y-axial direction, the cost "Y costxi (T xi, Ly)" when the wiring formed from the i-th layer passes above the cell rows in parallel with the cell rows, and the cost "Y costyi (T yi, Ry)" when the wiring formed from the i-th layer extends above the cell rows perpendicularly to the cell rows, can also be obtained by the same principle as in the case of FIGS. 5A and 5B.

That is:

$$Y \text{ costxi } (T xi, L y) = Pi \{T xi - b (L x \cdot O vi/Pi)\} \quad (7)$$

$$Y \text{ costyi } (T yi, R y) = Pi \{T yi - a (R x \cdot O hi/Pi)\} \quad (8)$$

From the costs thus obtained, the direction of the cell rows is determined in accordance with the flowchart shown in FIG. 3.

The CPU 21 illustrated in FIG. 1 executes the above-described process in accordance with a program, etc. stored in the memory 23, and determines layouts. Further, the CPU 21 makes the display section 24 display each layout at the corresponding layout designing stage. The designer inputs required instructions and data and adds corrections, etc. to the designed contents via the input section 25.

Second Embodiment

Figure 6:
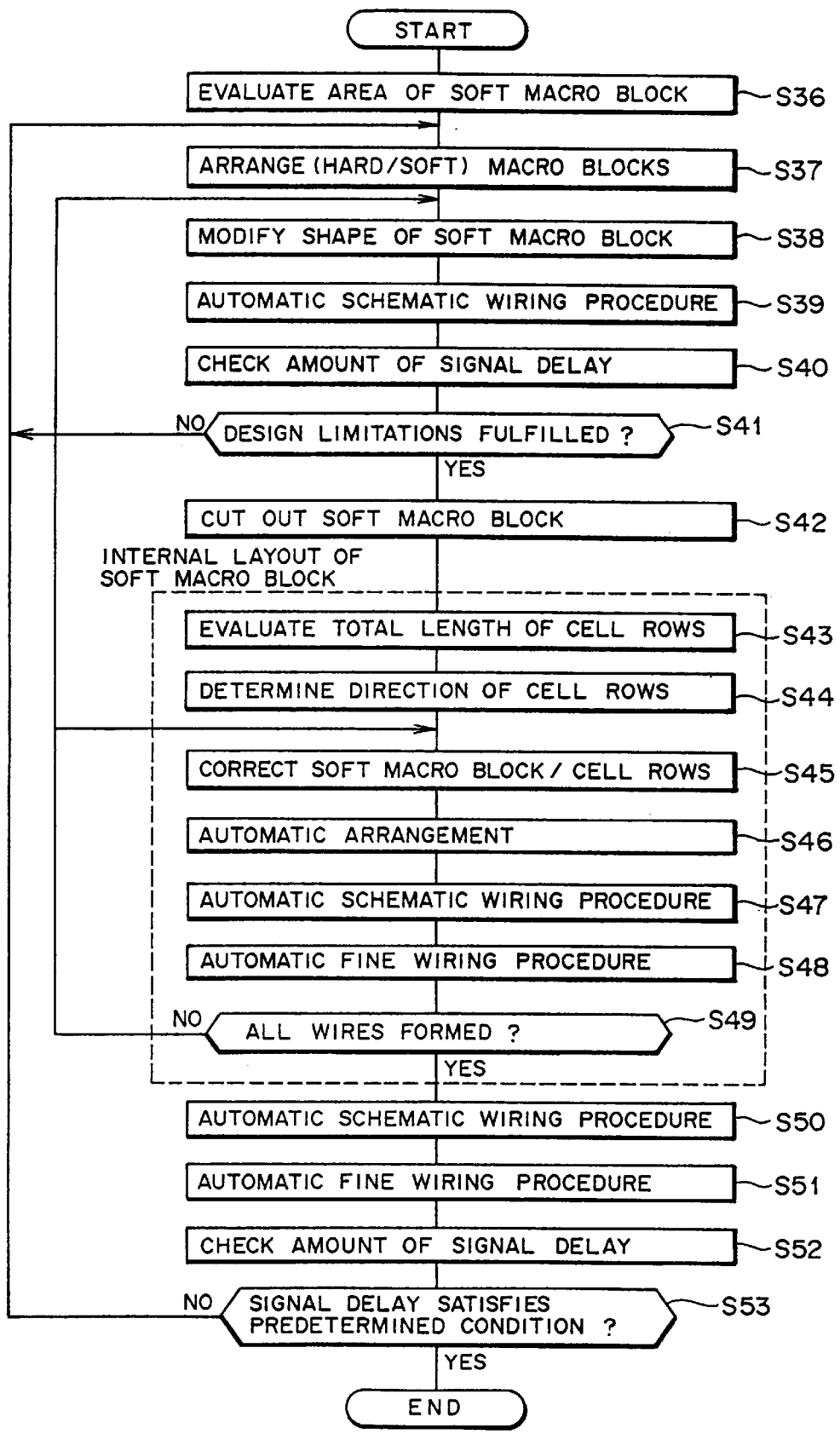
FIG. 6 is a flowchart showing a layout designing method according to the second embodiment of the present invention.

FIG. 6 shows a brief flowchart showing a layout designing method according to the second embodiment of the present invention.

In the process shown in FIG. 6, the steps (S36 to S42) between the step of evaluating the area of the soft macro block and the step of cutting out the soft macro are the same as the steps S1 to S7 shown in FIG. 2.

Of the steps forming a process for designing the internal layout of the soft macro, steps (S43, S44 and 46 to S49) other than the step (S45) of correcting the soft macro block and/or the cell rows are the same as the steps S8, S9 and S11 to S14 of the first embodiment which have been explained with reference to FIG. 2.

The step S45 of correcting the soft macro and/or the cell rows will now be explained.

Figure 7A:
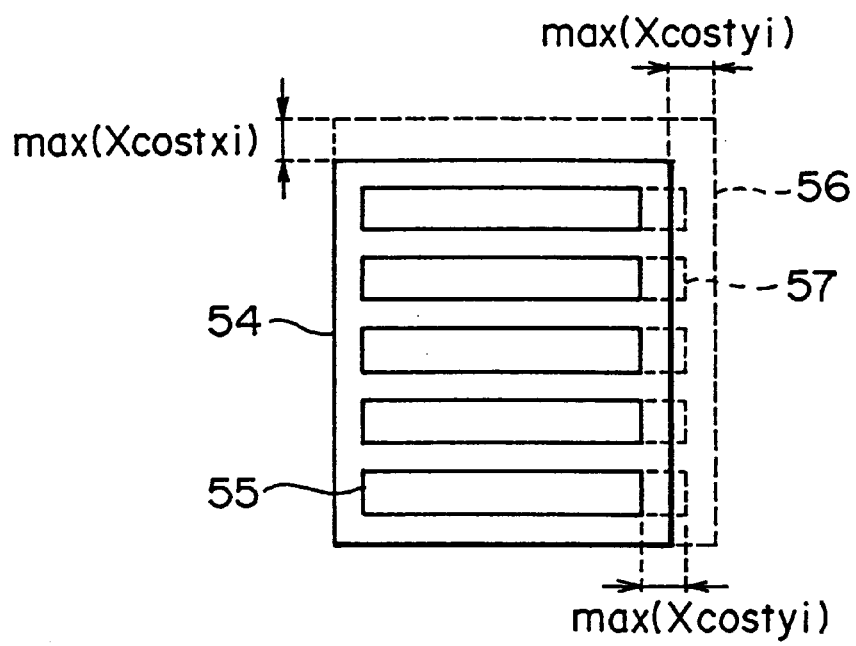
FIGS. 7A and 7B are conceptual diagrams showing the step, recited in FIG. 6, of correcting the soft macro block and/or the cell rows.
Figure 7B:
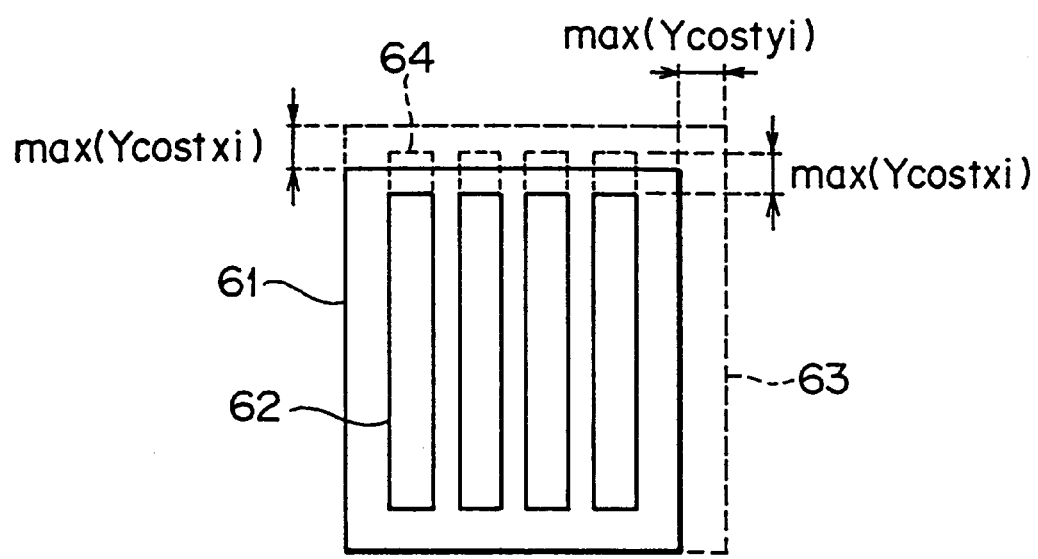
Figure 9A:
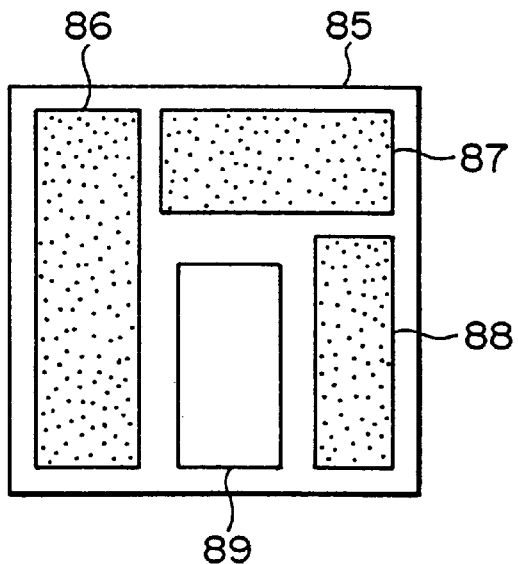
FIGS. 9A and 9B are diagrams showing examples of the result of the layout designing performed according to the hierarchical layout designing method shown in FIG. 8.
Figure 9B:
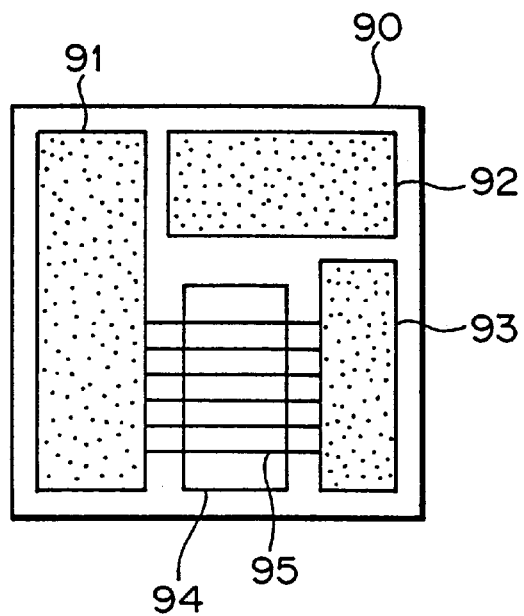
Figure 10A:
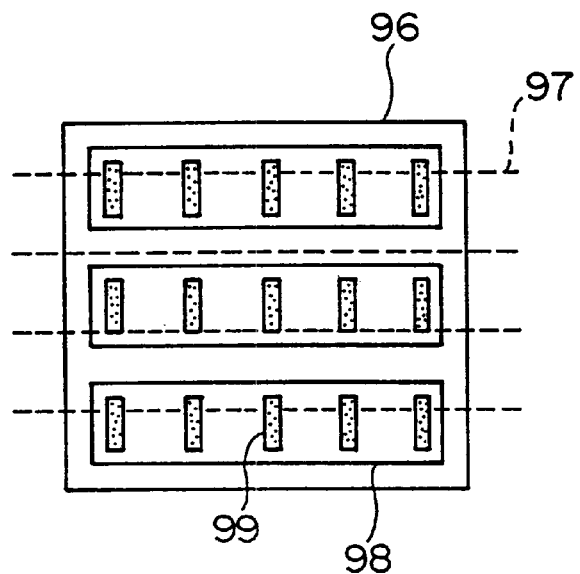
FIGS. 10A and 10B are diagrams showing examples of the result of the layout designing performed according to the hierarchical layout designing method shown in FIG. 8.
Figure 10B:
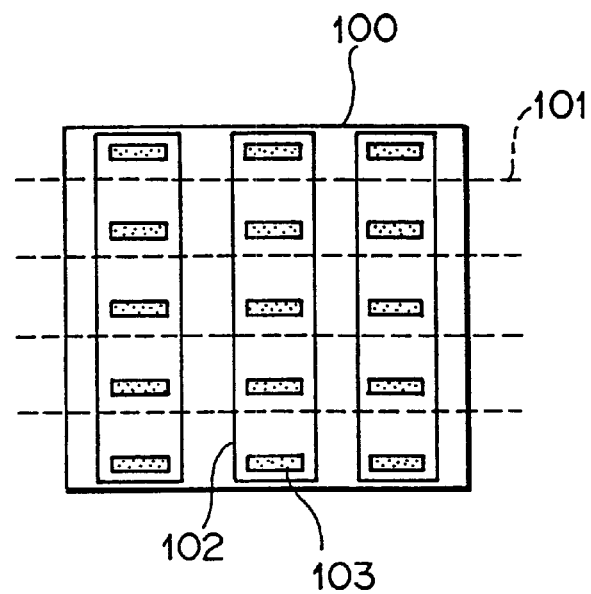

FIGS. 7A and 7B are conceptual diagrams for explaining the step (S45) of correcting the soft macro and/or the cell rows. The meanings of the various variables shown in FIGS. 7A and 7B are the same as those of the first embodiment which have been explained with reference to FIGS. 2 to 5B. Furthermore, the value of each variable is determined by the step (S44) of determining the direction of the cell rows, as in the case of the step S9 of the first embodiment. By the step S45 of correcting the soft macro block and/or the cell rows, the size of the cell rows of the soft macro block is corrected based on the passing costs obtained assuming that the wires extend in the x-axial and y-axial directions.

FIG. 7A is a conceptual diagram showing the correcting step in the case where the cell rows extend in the x-axial direction. The costs when the wiring formed from the i-th layer pass above the cell rows in the x-axial direction are represented by "X costxi". Of the costs "X costxi" (i=1 to n), the maximum value "max (X costxi)" indicates a quantity which can cause a deficiency of the wiring area in the y-axial direction. Accordingly, the above maximum value is added to the macro block's dimension "My" in the y-axial direction, and the dimension {My+max (X costxi)} as a result of the addition is used as the new dimension "My". Similarly, of the costs "X costyi" (i=1 to n), the maximum value "max (X costyi)" indicates a quantity which can cause a deficiency of the wiring area in the x-axial direction. Accordingly, the above maximum value is added to the macro block's dimension "Mx" in the x-axial direction, and the dimension {Mx+max (X costyi)} as a result of the addition is used as the new dimension "Mx". Moreover, in the x-axial direction, the cell row length "Lx" is similarly corrected, and "{Lx+max (X costyi)}" is used as the new length "Lx". In this manner, the shapes of a macro block 54 and cell rows 55 before the correction are corrected, thereby attaining the shapes of a macro block 56 and cell rows 57.

FIG. 7B is a conceptual diagram showing the correction step in the case where the cell rows extend in the y-axial direction. Similarly in the case of FIG. 7B, the same correction as that in the case of FIG. 7A when the cell rows extend in the x-axial direction is performed to correct the dimensions "My", "Mx" and "Ly", and the dimensions "{My+max (Y costxi)}", "{Mx+max (Y costxi)}" and "{Ly+max (Y costxi)}" after the correction are used as the new dimensions "My", "Mx" and "Ly". In this manner, the shapes of a macro block 61 and cell rows 62 before the correction are corrected, thereby attaining the shapes of a macro block 63 and cell rows 64 after the correction.

The maximum values of the costs may be multiplied by any arbitrary coefficient, and the resultant values may be used as the corrected values.

After the internal layout of the soft macro block has been designed in the above-described fashion, the layout of the chip is designed. Since the size and shape of the soft macro block have already been corrected at that point, wiring paths around the soft macro blocks are corrected by the automatic schematic wiring procedure (step S50). The step S50 is the same as the step S39. In this case, however, the step S50 is applied only to any wiring whose path needs to be corrected as a result of the size and shape of the soft macro block having been corrected by the step S45, thus limiting the correction of the wiring route of the entire chip to the minimum necessary extent.

According to the second embodiment, the sizes of the soft macro block and cell rows are corrected by the step S45 in the case where there is the possibility that a deficiency of the wiring area can occur in the soft macro block due to the formation of a passing wiring. By so doing, the formation of the internal wiring of the soft macro block is facilitated, reducing the occurrence of the problem that the internal wiring of the soft macro block have to be redesigned by repeating the steps after the step S38 or S45 at the point it is determined (in the step S49) whether all wires could be formed without departing from the wiring rules. However, there may be the case where the review of the wiring on chip level becomes necessary as a result of the size of the soft macro block having been corrected.

According to the present invention, as explained above, the influences which wiring layers for the wires which are to pass the determined soft macro block, the wiring direction and the number of wires will exert on the internal wiring of the soft macro block, are calculated in order to determine the direction and shape of the cell rows in the soft macro block.

By so doing, the percentage of wires making up a passing wiring and which have to take roundabout routes is reduced, optimizing the internal wiring of the soft macro block and the wiring route of the entire chip. This reduces the need to conduct redesigning due to the wiring formation being unfinished and due to a predetermined condition being unsatisfied by the signal delay, and reduces the designing period accordingly.

The present invention is not limited to the above-described embodiments, and various modifications and applications are possible. The system structure illustrated in FIG. 1, for example, is merely an example. Moreover, the procedures by which the steps shown in FIGS. 2 and 6 are carried out can be modified when needed.

It is also possible to realize the present invention by means of a general type computer. For example, programs for executing the processes described previously, and fixed data, etc. can be stored in a recording medium (such as a CD-ROM), and the programs can be read out from the recording medium and installed in the aforementioned general type computer in order to use the computer as the designing apparatus of the present invention. Furthermore, it is also possible to realize the designing method of the present invention by running the aforementioned programs.

What is claimed is:

1. A hierarchical layout design method for a semiconductor device, comprising:

determining layout positions in which hard macro blocks and a soft macro block are to be placed;

forming a wiring which connects the hard macro blocks to each other using a path which passes above the soft macro block;

forming cell rows in which cells are to be placed in the soft macro block; and forming an internal wiring of the soft macro block, wherein forming cell rows comprises:

evaluation of an extent of an influence which a wiring passing above the soft macro block will exert on the internal wiring of the soft macro block; and a determination of an extending direction in which the cell rows are to extend in the soft macro block based on a result of said evaluation.

2. The hierarchical layout designing method according to claim 1, further comprising:

correction of at least one of a shape and size of the soft macro block and at least one of a shape and size of the cell rows, in accordance with the extent of the influence which has been evaluated by said evaluation.

3. The hierarchical layout designing method according to claim 1, wherein said evaluation includes evaluating the extent of the influence which the wiring passing above the soft macro block will exert on the internal wiring of the soft macro block, based on wiring layers for forming the wiring passing above the soft macro blocks wiring directions and the number of wires forming the wiring.

4. The hierarchical layout designing method according to claim 1, wherein:

said evaluation includes calculating a first cost and a second cost, said first cost being a cost when the cell rows are formed extending in a first direction, and said second cost being a cost when the cell rows are formed extending in a second direction; and by said determination, said first and second costs are compared with each other, and a direction in which a lower one of said first and second costs is attained is determined as extending direction of the cell rows.

5. The hierarchical layout designing method according to claim 1, wherein:

by said evaluation, costs when a wiring formed from each of wiring layers passes above the soft macro block are calculated, and maximum values of the costs calculated in association with the wiring layers are obtained; and based on the obtained maximum values, the extending direction of the cell rows is determined through said determination.

6. The hierarchical layout designing method according to claim 1, wherein:

said evaluation includes:

calculating a first sum of a cost when a wiring extending in a first direction passes above the soft macro block and a cost when a wiring extending in a second direction passes above the soft macro, in the case where the cell rows are extending in the direction, and calculating a second sum of a cost when the wiring extending in the first direction passes above the soft macro block and a cost when the wiring extending in the second direction passes above the soft macro block, in the case where the cell rows are formed extending in the second direction; and through said determination, said first and second sums compared with each other, and a direction in which a lower of said first and second sums is attained is determined as the extending direction of the cell rows.

7. The hierarchical layout designing method according to claim 1, wherein:

when a number of wiring layers is "n", said evaluation includes:

calculating, in association with each of wiring layers, costs when a wiring extending in a first direction passes above the soft macro block and costs when a wiring extending in a second direction passes above the soft macro block, in the case where the cell rows are formed extending in the first direction, and calculating a first sum of a maximum value of the calculated costs when the wiring extending in the first direction passes above the soft macro block and a maximum value of the calculated costs when the wiring extending in the second direction passes above the soft macro block, and calculating, in association with each of the wiring layers, costs when the wiring extending in the first direction passes above the soft macro block and costs when the wiring extending in the second direction passes above the soft macro block, in the case where the cell rows are formed extending in the second direction, and calculating a second sum of a maximum value of the calculated costs when the wiring extending in the first direction passes above the soft macro block and a maximum value of the calculated costs when the wiring extending in the second direction passes above the soft macro block; and through said determination, said first sum and said second sum are compared with each other, and the cell rows are formed extending in the first direction when said first sum is smaller than said second sum, and the cell rows are formed extending in the second direction when said second sum is smaller than said first sum.

8. The hierarchical layout designing method according to claim 7, further comprising correcting at least one of a shape and size of the soft macro block and at least one of a shape and size of the cell rows, based on the costs calculated by said evaluation step.

9. A hierarchical layout designing apparatus comprising:
means for arranging hard macro blocks and a soft macro block;
means for forming a wiring which connects the hard macro blocks to each other using a path which passes above the soft macro block;
evaluation means for evaluating an extent of an influence which a wiring passing above the soft macro block will exert on an internal wiring of the soft macro block; and
formation means for forming the cell rows in the soft macro block after determining an extending direction in which the cell rows are to extend in the soft macro block, based on an extent of influence determined by the evaluation means.

10. The hierarchical layout designing apparatus according to claim 9, further comprising
correction means for correcting at least one of a shape and size of the soft macro block and at least one of a shape and size of the cell rows, in accordance with the extent of the influence which has been evaluated by said evaluation means.

11. The hierarchical layout designing apparatus according to claim 9, wherein said evaluation means includes means for evaluating the extent of the influence which the wiring passing above the soft macro block will exert on the internal wiring of the soft macro block, based on wiring layers for forming the wiring passing above the soft macro block, wiring directions and the number of wires forming the wiring.

12. The hierarchical layout designing apparatus according to claim 9, wherein said evaluation means includes means for calculating a first cost and a second cost, said first cost being a cost when the cell rows are formed extending in a first direction, and said second cost being a cost when the cell rows are formed extending in a second direction; and
said formation means includes means for comparing said first and second costs with each other and forming the cell rows after determining, as the extending direction of the cell rows, a direction in which a lower one of said first and second costs is attained.

13. The hierarchical layout designing apparatus according to claim 9, wherein said evaluation means includes means for calculating costs when a wiring formed from each of wiring layers passes above the soft macro block, and for calculating maximum values of the costs calculated in association with the wiring layers; and
said formation means includes means for determining the extending direction of the cell rows, based on the obtained maximum values.

14. The hierarchical layout designing apparatus according to claim 9, wherein:
said evaluation means includes
means for calculating a first sum of a cost when a wiring extending in a first direction passes above the soft macro block and a cost when a wiring extending in a second direction passes above the soft macro, in the case where the cell rows are formed extending in the first direction, and
means for calculating a second sum of a cost when the wiring extending in the first direction passes above the soft macro and a cost when the wiring extending in the second direction passes above the soft macro, in the case where the cell rows are formed extending in the second direction; and
said formation means includes means for comparing said first and second sums with each other and determining, as the extending direction of the cell rows, a direction in which a lower one of said first and second sums is attained.

15. The hierarchical layout designing apparatus according to claim 9, wherein:
when a number of wiring layers is "n", said evaluation means includes
means for calculating, in association with each of wiring layers, costs when a wiring extending in a first direction passes above the soft macro block and costs when a wiring extending in a second direction passes above the soft macro block, in the case where the cell rows are formed extending in the first direction, and means for calculating a first sum of a maximum value of the calculated costs when the wiring extending in the first direction passes above the soft macro block and a maximum value of the calculated costs when the wiring extending in the second direction passes above the soft macro block, and
means for calculating, in association with each of the wiring layers, costs when the wiring extending in the first direction passes above the soft macro block and costs when the wiring extending in the second direction passes above the soft macro block, in the case where the cell rows are formed extending in the second direction, and means for calculating a second sum of a maximum value of the calculated costs when the wiring extending in the first direction passes above the soft macro block and a maximum value of the calculated costs when the wiring extending in the second direction passes above the soft macro block; and
said formation means includes means for comparing said first sum and said second sum with each other, and forming the cell rows so as to extend in the first direction when said first sum is smaller than said second sum and forming the cell rows so as to extend in the second direction when said second sum is smaller than said first sum.

16. The hierarchical layout designing apparatus according to claim 15, further comprising means for correcting at least one of a shape and size of the soft macro block and at least one of a shape and size of the cell rows, based on the costs calculated by said evaluation means.

17. A computer readable recording medium in which a program has been recorded, said program controlling a computer to execute a process for hierarchical layout design of a semiconductor device, the process comprising:
determining layout positions in which hard macro blocks and a soft macro block are to be placed;
forming a wiring which connects the hard macro blocks to each other using a path which passes above the soft macro block;
evaluation of an influence which the wiring passing above the soft macro block will exert on an internal wiring of the soft macro block; and
determining a direction in which the cell rows are to extend in the soft macro block based on a result of the evaluation.

18. The recording medium according to claim 17, wherein the process further comprises correcting at least one of a shape and size of the soft macro block and at least one of a shape and size of the cell rows, based on a result of said evaluation.

* * * * *